US006548972B2

(12) United States Patent
Takagi

(10) Patent No.: US 6,548,972 B2
(45) Date of Patent: Apr. 15, 2003

(54) CONTROL UNIT AND METHOD OF MANUFACTURING THE SAME

(75) Inventor: Kanji Takagi, Kyoto (JP)

(73) Assignee: Omron Corporation, Kyoto (JP)

( * ) Notice: Subject to any disclaimer, the term of this patent is extended or adjusted under 35 U.S.C. 154(b) by 142 days.

(21) Appl. No.: 09/757,486

(22) Filed: Jan. 11, 2001

(65) Prior Publication Data

US 2001/0021103 A1 Sep. 13, 2001

(30) Foreign Application Priority Data

Jan. 12, 2000 (JP) ........................................ 2000-004097

(51) Int. Cl.[7] ............................ H02P 1/00; H02P 1/22; H02P 1/40; H02P 3/00; H02P 3/20
(52) U.S. Cl. ....................................... 318/293; 361/688
(58) Field of Search ................................ 361/688, 752; 318/139, 254, 256, 280, 287, 293

(56) References Cited

U.S. PATENT DOCUMENTS

| 5,602,451 A | * | 2/1997 | Kohge et al. ............... 318/293 |
| 6,068,078 A | * | 5/2000 | Rau et al. .................... 180/446 |
| 6,201,700 B1 | * | 3/2001 | Tzinares et al. ............. 165/185 |

FOREIGN PATENT DOCUMENTS

| JP | 6-270824 | 9/1994 |
| JP | 8-11732 | 1/1996 |

* cited by examiner

Primary Examiner—Jeffrey Donels
(74) Attorney, Agent, or Firm—Foley & Lardner

(57) ABSTRACT

A drive circuit 12 is mounted on a metal substrate 50, a control circuit 13 is mounted on an insulating substrate 70, and a large current circuit component such as an electrolytic condenser 18 is mounted on a baseboard 30 integrated with a metallic circuit conductor constituent member 31 by insert molding, in which the metal substrate 50 and the insulating substrate 70 are laminated on the baseboard 30.

19 Claims, 6 Drawing Sheets

CONTROL UNIT AND METHOD OF MANUFACTURING THE SAME

BACKGROUND OF THE INVENTION

1. Field of the Invention

The present invention relates to a control unit and a method of manufacturing the same for an electric power steering device which is more suitable to be mounted particularly on the relatively large vehicles, or to a control unit for a similar device.

2. Description of the Related Art

Generally, an electric power steering device has a torque sensor for sensing a steering torque produced on a steering shaft by the operation of a handle, and an assist motor (hereinafter simply referred to as a motor) attached to the steering shaft to produce a steering auxiliary torque bypassing an electric current from a battery of a vehicle to the assist motor in accordance with the sensed steering torque. This electric power steering device is difficult to produce a large steering auxiliary torque, in contrast to a hydraulic type, and conventionally was employed mainly in the light cars. However, this electric power steering device has some advantages that electronic control is easy, or the hydraulic pump or hydraulic pipe is unnecessary, and the structure is simple. In recent years, it is examined that the electric power steering device is applied to the small cars having a displacement level of 1800 cc, and will be possibly applied to the large cars in the future.

For the current control of the assist motor in this electric power steering device, a drive circuit having an H bridge circuit composed of normally four (or four pairs) FETs (Field Effect Transistors) is used to drive the assist motor in accordance with a PWM (Pulse Width Modulation) method under the control of a control circuit comprising a microcomputer. Also, the electric power steering device of this kind has a power back-up capacitor normally consisting of an electrolytic capacitor, which is connected to a high potential power line for supplying an electric power from the battery of the vehicle to the drive circuit. The power back-up capacitor resolves the problems with a ripple current or a temporary power voltage drop that may be caused by wiring resistance when a large current flows. Also, the drive circuit, a control circuit, and a large current circuit component for the power back-up capacitor are mounted on a circuit substrate within one unit, referred to as a control unit. This control unit (hereinafter simply referred to as a unit) was hitherto disposed in a space which was hidden from the driver within a compartment of the vehicle.

The prior art control unit for the electric power steering device had a structure of accommodating one sheet of circuit substrate within a metallic case, in which the circuit substrate was constructed as shown in FIG. 6, for example. That is, its basic structure is the same as that of a so-called printed board, in which the circuit conductors or passive elements are formed as a wiring pattern by the printed wiring technique on an insulating substrate made of resin. The IC chips or parts such as the FET or power back-up capacitor to constitute the control circuit are mounted thereon.

In this connection, a circuit substrate 1 as shown in FIG. 6 comprises a FET chip 2 molded by resin, a power back-up capacitor 3, and an IC chip of a microcomputer 4 constituting the control circuit. The circuit substrate 1 further comprises a bus bar 5 (conductor plate), a heat radiator 6, and a relay 7. The bus bar S constitutes a circuit conductor such as a conduction line of the assist motor through which a large current flows. The heat radiator 6 radiates the heat generated mainly in the FET 2. The relay 7 opens or closes the conduction line of the assist motor under the control of the microcomputer 4.

Since a current of about 25 A at maximum flows through the assist motor in the light cars, it was practically impossible, due to the reasons of the heat generation or the space on the substrate, to constitute the conduction line of the assist motor using a wiring pattern on the circuit substrate 1 that is limited in the thickness. Therefore, the conduction line was constituted by attaching the bus bar 5, which was considerably larger in width and thickness than the wiring pattern on the circuit substrate 1, on the circuit substrate 1. The quantity of heat generated in the FET 2 is very large depending on the working conditions, and if left alone, the substrate rises in temperature to about several hundreds ° C. in short time. Hence, the radiator 6 was fabricated of aluminum having high heat conductivity, and placed in parallel with each FET 2 at the end of the circuit substrate 1, while being bonded with a back face of the FET 2.

By the way, the prior art control unit for the electric power steering device had the following problems with the applicability or on-board capability particularly for the relatively large vehicles.

(i) In prior art, the parts were arranged in plane on one sheet of circuit substrate, so that the size of the circuit substrate became large in a planar direction and the weight was heavy. In particular, in the case of the relatively large vehicles such as the small cars, the current of the assist motor reaches a maximum of 60 to 80 A, making the radiator or bus bar extremely large and heavy. This is directly reflected on the whole size or weight of the unit, resulting in extremely large and heavy unit as a whole. And in the case of the small cars, there is an unnegligible problem with the voltage drop which is caused by the wiring resistance between the unit and the motor owing to increased current of the assist motor. In the situation where the wiring can not be thickened owing to the costs, it is required in practice that the control unit is placed near the assist motor (i.e., within an engine room) However, it is significantly difficult to place it in a space within the engine room, if the unit is large, and further to apply the device itself to the small cars due to the high costs or the limited space.

(ii) To apply the device to the small cars, in the case where the unit is placed within the engine room owing to the necessity as described above, the unit must have a waterproof structure to withstand the submersion under water. However, in prior art, such water resistance was not considered at all, resulting in a problem that such waterproof structure must be constructed inexpensively. Since the water does not normally permeate into the car room, too high water resistance is not required if the unit is disposed within the car room. However, in the case where the unit is placed within the engine room (i.e., beneath the engine room in which the assist motor is placed), the water may possibly permeate into the engine room, whereby the unit must have a water resistance to withstand the submersion under water.

(iii) In prior art, the circuit components such as a power back-up capacitor or a relay through which a large current flows were mounted on one sheet of circuit substrate consisting of a normal printed board typically by soldering the terminals. Particularly in the case where the device is applied to the small cars to increase the current, the solder melts on the connecting portion of this terminal, resulting in a problem that the possibility of improper connection can not be ignored.

In Japanese Patent Unexamined Publication No. Hei. 6-270824 or Japanese Patent Unexamined Publication No. Hei. 8-11732, to solve the above-described problem (i) (larger size of the unit), an electric power steering circuit device (i.e., a control unit for the electric power steering device) was disclosed in which a drive circuit having a bridge circuit comprising FET is mounted on a metal substrate (or a radiating plate), and a control circuit containing a microcomputer is mounted on a separate insulating substrate (i.e., a normal printed board), the metal substrate and the insulating substrate being disposed one on another with a predetermined spacing. With this device, two substrates each having classified circuit components are laminated, giving rise to the effect of smaller size.

However, this device has a structure of simply laminating two substrates, attaching circuit components such as a power back-up capacitor to a support member interposed between the substrates, and soldering the terminals of circuit components such as the power back-up capacitor to the wiring pattern on the support substrate. Therefore, the space of disposing at least the circuit conductor corresponding to the prior art bus bar 5 as described previously has not been reduced, and further is expected to be reduced. Also, the problem (ii) with the water resistance and the problem (iii) with the reliability of connection have not been solved at all.

The problem (ii) with the water resistance is not limited to the control unit of the electric power steering device, but also may arise with the control unit for the other devices (e.g., an engine control system, an AT control system, an anti skid braking system (ABS system) or a power window system) mounted on the vehicle. In recent years, particularly there is the increasing demand for safer vehicles, whereby each device is required to have the higher reliability when the vehicle is submerged under water. Even with the control unit disposed within the vehicle compartment, there is the trend of demanding for the high waterproof performance.

SUMMARY OF THE INVENTION

The present invention has been achieved in the light of the above-mentioned problems, and it is an object of the invention to provide a control unit and a method of manufacturing the control unit for an electric power steering device with the enhanced applicability or on-board capability particularly for the relatively large vehicles.

Moreover, it is another object of the invention to provide a control unit which can maintain the high water resistance when submerged under water.

According to the present invention, there is provided a control unit for an electric power steering device that uses an assist motor linked to a steering system of a vehicle to generate a steering auxiliary torque, comprising a drive circuit containing a switching element for switching the connection of each coil terminal of the assist motor to a high potential power line or a low potential power line, a control circuit for controlling the operation of the assist motor by controlling the operation of the switching element of the drive circuit, a large current circuit component containing a power back-up capacitor connected to the high potential power line, a metal substrate made of a metal and having the drive circuit mounted, an insulating substrate made of an insulating material and having the control circuit mounted, and a baseboard having a metallic circuit conductor constituent member integrated with a resin substance by insert molding and the large current circuit component mounted, wherein the metal substrate and the insulating substrate are attached on the baseboard to overlap each other.

Herein, a "drive circuit" mounted on the metal substrate may contain a bridge circuit for PWM driving the assist motor. Also, a "switching element" may be an FET constituting the bridge circuit for PWM driving the assist motor. A "control circuit" mounted on the insulating substrate comprises, for example, a microcomputer or its peripheral circuits (through which no large current flows). A "large current circuit component" mounted on the baseboard may be a ceramic condenser for countermeasure of the electric wave to suppress the noise emission, or a relay that is controlled by the control circuit to open or close the conduction line, besides the power back-up capacitor (normally an electrolyte capacitor). It is needless to say that the circuit components through which no large current flows may be mounted on the baseboard. Also, a "metallic circuit conductor constituent member" may be a metallic plate member subjected to press working.

With this invention, the circuits or parts are mounted on the corresponding substrates that are optimal for each function, and the substrates are laminated on the baseboard. Therefore, the unit can be reduced in size, and mounted on the vehicle more suitably.

That is, first of all, the drive circuit containing a switching element for switching the energizing state of the assist motor and having a large quantity of heat generated is mounted on the metal substrate having excellent heat conductivity and secured for high ability of heat radiation. Thereby, the width or interval of a wiring pattern on the metal substrate making up the circuit conductor of this drive circuit can be set to be narrower than the prior art, resulting in smaller area of the drive circuit mounting portion or the whole metal substrate.

The control circuit having less current flowing is mounted on the ordinary insulating substrate, and can be disposed within a minimum of area.

And the large current circuit component containing a power back-up capacitor is mounted on the baseboard having a circuit conductor made up by insert molding a metallic member. Namely, the circuit conductor through which a large current flows, which was constructed by the bus bar on the insulating substrate in prior art, is integrated with a resin base substance of the baseboard by insert molding the metallic member. Therefore, by increasing the set thickness of this metallic member, the circuit conductor for passing the large current can have a sufficient capacity (cross sectional area) while the size of the circuit conductor in a planar direction is suppressed to a small value. Further, since this circuit conductor is buried into the baseboard by insert molding, the space for arranging a mounting portion of the large current circuit component in a thickness direction can be reduced, as compared with when the bus bar is provided on the substrate.

Moreover, since the metal substrate and the insulating substrate are laminated on the baseboard, the size of the whole unit in a planar direction can be reduced significantly.

Accordingly, the unit can be reduced in size in a planar direction, as well as in a thickness direction to equivalent to or less than the size in prior art, and correspondingly the weight can be decreased. Hence, for the relatively large vehicles having a larger current amount of the assist motor, the unit can exhibit the enhanced applicability or on-board capability in the respects of the space and weight.

According to a preferred embodiment of this invention, a heat radiating plate is disposed to constitute an outside wall of the unit, a back face of the metal substrate being bonded with an inside face of this heat radiating plate.

With this embodiment, the higher ability of radiating the heat generated in the drive circuit can be secured, while the increasing number of parts is suppressed. Further, there is the advantage that mounting the metal substrate on the baseboard or its electrical connection can be facilitated. Because the heat radiating plate constitutes the outside wall, there is no need of providing a cover member making up the outside wall in an area where the heat radiating plate is provided. As a result, an outside face of the heat radiating plate is exposed to the outer atmosphere, giving rise to the higher ability of radiating the heat. For example, the metal substrate itself can be also constructed to also act as a heat radiating member. In this case, the metal substrate itself is required to have a heat radiating area in the respect of size or shape, it being apprehended that mounting the metal substrate on the baseboard and its electrical connection can not be necessarily facilitated. However, if the heat radiating plate and the metal substrate are separated, such a problem will not arise.

According to a further preferred embodiment of this invention, an electrode of the large current circuit component is welded to a predetermined region of the circuit conductor constituent member of the baseboard.

With this embodiment, Even when its connecting portion is heated owing to a large current flowing through the large current circuit component, there possibly occurs no inconvenience such as solder melting, whereby the large current circuit component provides a high reliability of connection. Accordingly, the unit can be further enhanced in applicability to the large vehicles in the aspect of the higher connection reliability of the large current circuit component.

According to a further preferred embodiment of this invention, a frame-shaped resin case is placed to surround the baseboard and constitute an outside wall of the unit, the baseboard being substantially a sheet, and accommodated within the resin case.

With this embodiment, the mounting operation of the large current circuit component on the baseboard can be facilitated, and the baseboard or the outside wall surrounding it can be manufactured more easily. For example, a wall face portion to make the outside wall can be provided integrally with an outer peripheral portion of the baseboard, but in this case, the baseboard is shaped unlike a simple sheet, and surrounded by the wall face portion, the wall face portion hindering the work, thereby making it difficult to mechanically implement the mounting or connecting operation of the large current circuit component, and resulting in the more costs. Also, the fabrication of the baseboard itself is relatively more difficult. However, this embodiment can eliminate such problems. Accordingly, the manufacturing costs can be reduced, and the applicability of the unit to the large vehicles can be enhanced.

According to a further preferred embodiment of this invention, the resin case is provided with a connector for the outside wiring, in which a predetermined electrode of this connector and a predetermined region of the circuit conductor constituent member of the baseboard are connected by screwing the terminals that mate with each other.

With this embodiment, there is no inconvenience of making a false connection owing to the welding flag or solder ball produced, when the welding or soldering is performed. As a result, there is the advantage that the unit can be enhanced in the operation reliability, and the connecting operation between the circuit conductor of the large current circuit component and the connector can be facilitated as compared with the welding or soldering.

According to a further preferred embodiment of this invention, the resin case is provided with a connector for the outside wiring, and the terminals for connecting a predetermined electrode of this connector and a predetermined region of the circuit conductor constituent member of the baseboard to a predetermined circuit conductor of the insulating substrate are disposed on one side of the insulating substrate.

Herein, a "terminal" means a portion for making the electrical connection of conductors or electrodes that are joined or engaged (fitted) with each other, or in some cases, by soldering, screwing, or welding. For example, the splicing pieces that are joined together, or a concave portion (including a through hole) and a convex portion (e.g., a projection or a pin) that are fitted with each other.

With this embodiment, the circuit connection of the baseboard with the insulating substrate having the control circuit mounted (i.e., connection of the circuit through which no large current flows, mainly, the signal line) is made simply on one side of the unit. Therefore, the operation of incorporating the insulating substrate having the control circuit mounted, or the operation of welding or soldering the terminals required in some cases after that incorporating operation can be easily mechanized.

The connection of this insulating substrate can be effected using a so-called press fit terminal, because the connecting circuit has no large current flowing. If the connecting terminals are collected on one side of the insulating substrate, the connecting operation is facilitated even in the case where the press fit terminal is employed. Note that the "press fit terminal" comprises one terminal like a pin and the other terminal being a through hole (i.e., a terminal like a through hole), the conduction state being secured by press fitting the pin-shaped terminal into the through hole terminal. For this press fit terminal, there is no need of welding or soldering, resulting in easier connecting operation.

According to a further preferred embodiment of this invention, the resin case is provided with a connector for the outside wiring, the connection of a predetermined electrode of the connector and a predetermined region of the circuit conductor constituent member of the baseboard with a predetermined circuit conductor of the insulating substrate is effected by one terminal provided on a face of the resin case and the baseboard opposed to the insulating substrate, and the other terminal that can engage or join with the one terminal upon an operation of attaching the insulating substrate on the baseboard, the other terminal being provided on a face of the insulating substrate opposed to the resin case and the baseboard.

With this embodiment, an intermediate assembly containing the baseboard and the resin case (sub-assembly) is first assembled, and then the insulating substrate is attached to the baseboard while the terminals on both sides are engaged or joined, and then the terminals are soldered together, as required. In this way, the assembling of the baseboard, the resin case and the insulating substrate is completed, and at the same time the electrical connection of the insulating substrate with the baseboard and the resin case (connector) is completed, resulting in improved assembling operation of the unit. In this case, if the metal substrate is pre-assembled with the baseboard and the electrical connection is completed, the assembling of the metal substrate, the baseboard and the insulating substrate, and the electrical connection between them are all completed at once.

According to a further preferred embodiment of this invention, the resin case is provided with a connector for the outside wiring, the connector comprising a fitting portion formed integrally with the resin case and into which another connector is fitted, and an electrode provided integrally in the resin case by insert molding.

With this embodiment, the fitting portion is securely prevented from being unsteady or shifted, whereby the operation of inserting or extracting the male connector (on the external equipment side) into or out of the female connector (on the unit side) can be effected stably. Also, the number of parts can be decreased in contrast to the case where the connector is provided as a separate part.

According to a further embodiment of this invention, an opening is formed in the baseboard where the metal substrate is attached to expose at least a mounting surface of the metal substrate to an opposite side of the baseboard where the metal substrate is attached, an inner surface of the opening surrounding the mounting surface of the metal substrate to form a concave portion for filling the molding material. Herein, the "mounting surface" as above referred to means an area on the surface of the metal substrate where at least the drive circuit is mounted.

With this embodiment, by pouring and fixing a predefined amount of molding material into the concave portion (e.g., thermosetting resin), the mounting surface of the metal substrate in which the circuit including at least the drive circuit is formed can be molded excellently.

According to a further preferred embodiment of this invention, a predetermined region of the circuit conductor constituent member of the baseboard and a predetermined circuit conductor of the metal substrate are connected by wire bonding.

With this embodiment, the problem does not arise with the soldering ball or welding flag, which may occur on the structure in which the terminal is stood on the metal substrate and connected to the baseboard by soldering or welding, thereby resulting in the higher reliability. The connecting operation of the metal substrate leads to the higher productivity or mass production capability.

According to a further preferred embodiment of this invention, an insulating cover member is provided as an outside wall of the unit which covers at least an opposite face of said baseboard where said metal substrate is attached. Herein, the insulating cover member may be made of synthetic resin, for example.

With this embodiment, there is no need of securing a predefined insulation distance between the circuit component or circuit conductor inside the unit and the outside wall of the unit, so that the outside wall of the unit can be disposed more inside, contributing to the smaller and enhanced on-board unit for the vehicle. Since the prior art unit of this kind had the outside wall consisting of a cover member normally made of metal, it was required to provide a sufficient clearance beyond a predefined insulation distance with respect to the circuit components provided internally.

According to a further preferred embodiment of this invention, the sealing for an attaching portion of the cover member is made by an adhesive seal.

With this embodiment, the unit is further reduced in size by employing the insulating cover member as the outside wall, while the attaching portion of this cover member is sealed more reliably, and the unit is secured for the high water resistance. This is because when the cover member made of synthetic resin is employed as the outside wall, there is the advantage that the insulation distance is unnecessary to provide. However, the synthetic resin cover is weaker in strength than the metallic cover member, and is difficult to achieve the reliable sealing with the ordinary packing needing a fastening force such as the O-ring. However, with an adhesive seal, the fastening force is unnecessary, and the reliable sealing is securely possible.

According to a further preferred embodiment of this invention, a mounting portion of the baseboard for mounting a large current circuit component containing at least a power back-up capacitor is disposed not to overlap the insulating substrate and the metal substrate.

With this embodiment, the unit is prevented from being larger in a thickness direction because the large current circuit component having relatively large parts and the insulating substrate are overlapped. Therefore, the size of the unit in the thickness direction is kept small, although the structure has a plurality of substrates laminated. As a result, the unit can be reduced in size, and further improved to be mounted on the vehicle.

According to a further preferred embodiment of this invention, the power back-up capacitor is disposed on one end side of the baseboard, and the metal substrate is disposed on the other end side of the baseboard.

With this embodiment, a large quantity of heat produced by the metal substrate is kept preventing from being conducted to the power back-up capacitor. The reliability or life of the power back-up capacitor consisting of an electrolytic capacitor that is weak to heat is improved, contributing to higher reliability or longer life of the whole unit.

The control unit for the electric power steering device of this invention, or the control unit for an on-board device of vehicle, that uses an assist motor linked to a steering system of the vehicle to generate a steering auxiliary torque, has a vent channel allowing the ventilation of the air into and out of the unit formed in a member constituting an outside wall of the unit, the vent channel comprising a breather space partitioned from the inside of the unit, an outside vent hole for communicating the breather space to the outside of the unit with a smaller cross sectional area than that of the breather space, and an inside vent hole for communicating the breather space into the unit, wherein the inside vent hole is fitted with a filter porous to air but impervious to water.

Herein, the "on-board device of vehicle" means any device or system to be mounted on the vehicle, like the-electric power steering device, and may be an engine control system, an AT control system, an anti skid braking system (ABS system), or a power window device, for example.

The "minute cross sectional area" means a cross sectional area of flow path which is so minute that a pressure difference between the inside and the outside of the unit may be sufficiently relieved, owing to the air within the breather space being brought through the inside vent hole into the inside of the unit, as required, while the water entering through the outside vent hole is filled in large quantity in the breather space to enclose the inside vent hole, when the unit is submerged under water. The "breather space" means a space having a sufficient capacity for such purposes.

With this embodiment, the internal pressure within the unit is prevented from dropping (or at least excessively below) below the external pressure owing to, for example, a reduction in inner pressure by cooling or a water pressure produced by the submerging water, when the unit is submerged under water. Hence, the water resistance can be prevented inexpensively and reliably from degrading owing to the pressure difference between the inside and the outside of the unit.

In the case where the unit has no vent channel with the breather space, but is simply of the air tight structure, it is requisite to have a seal structure for retaining the air tightness to withstand the pressure difference between the inside and the outside of the unit, which is expensive and takes a considerable space (for example, a simple adhesive seal is unusable), inevitably resulting in the larger size and increased costs. If the vent channel is provided with a filter alone but without the breather space, an entrance of this vent hole is covered with water, it being apprehended that the air can be passed into or out of the unit to adjust the pressure difference between the inside and the outside of the unit. As a result, the water resistance can not be necessarily assured owing to the pressure difference between the inside and the outside of the unit.

DETAILED DESCRIPTION OF THE PREFERRED EMBODIMENT

The preferred embodiments of the present invention will be described below with reference to the drawings.

Figure 5:
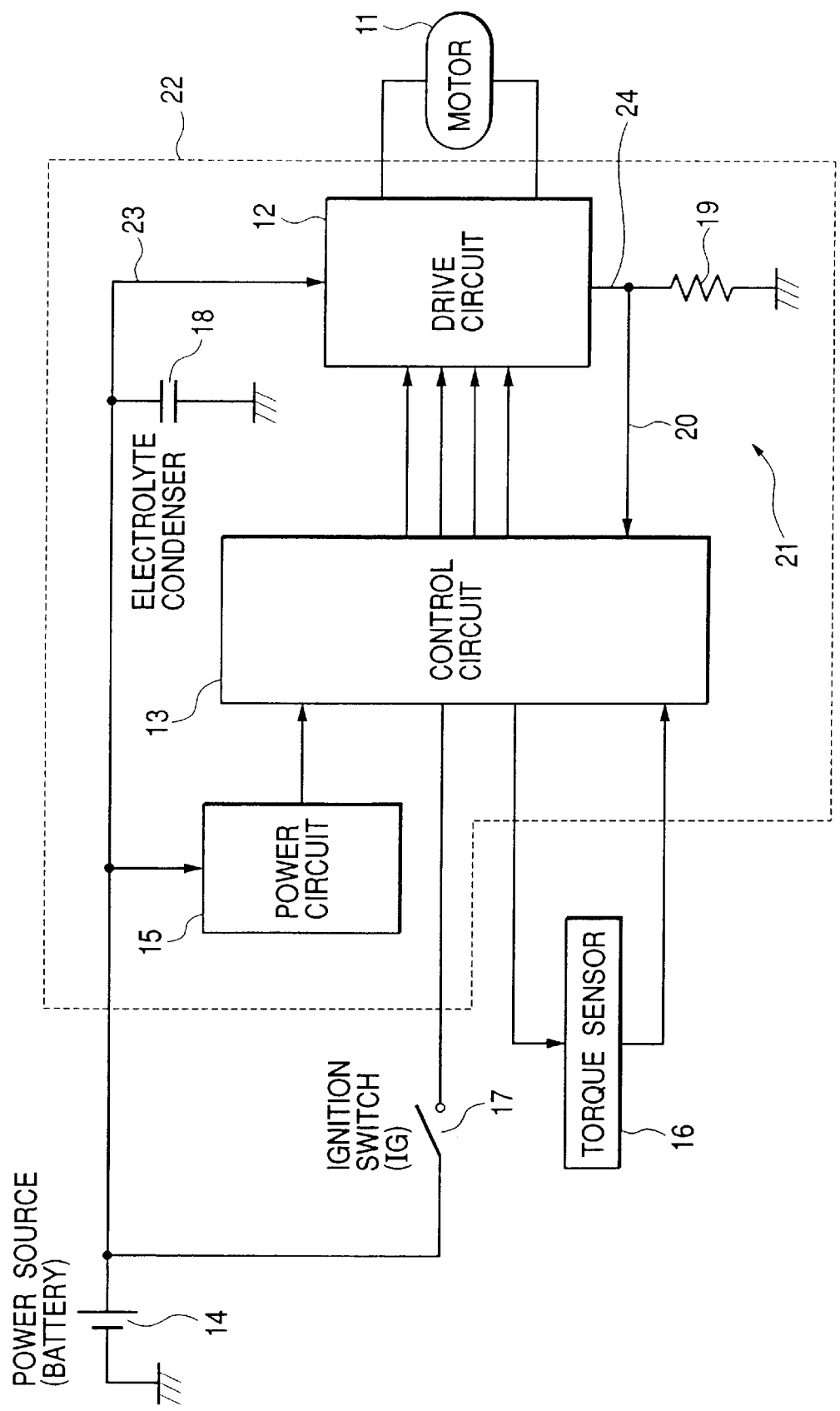
FIG. 5 is a block diagram showing the overall circuit configuration of an electric power steering device.
Figure 6:
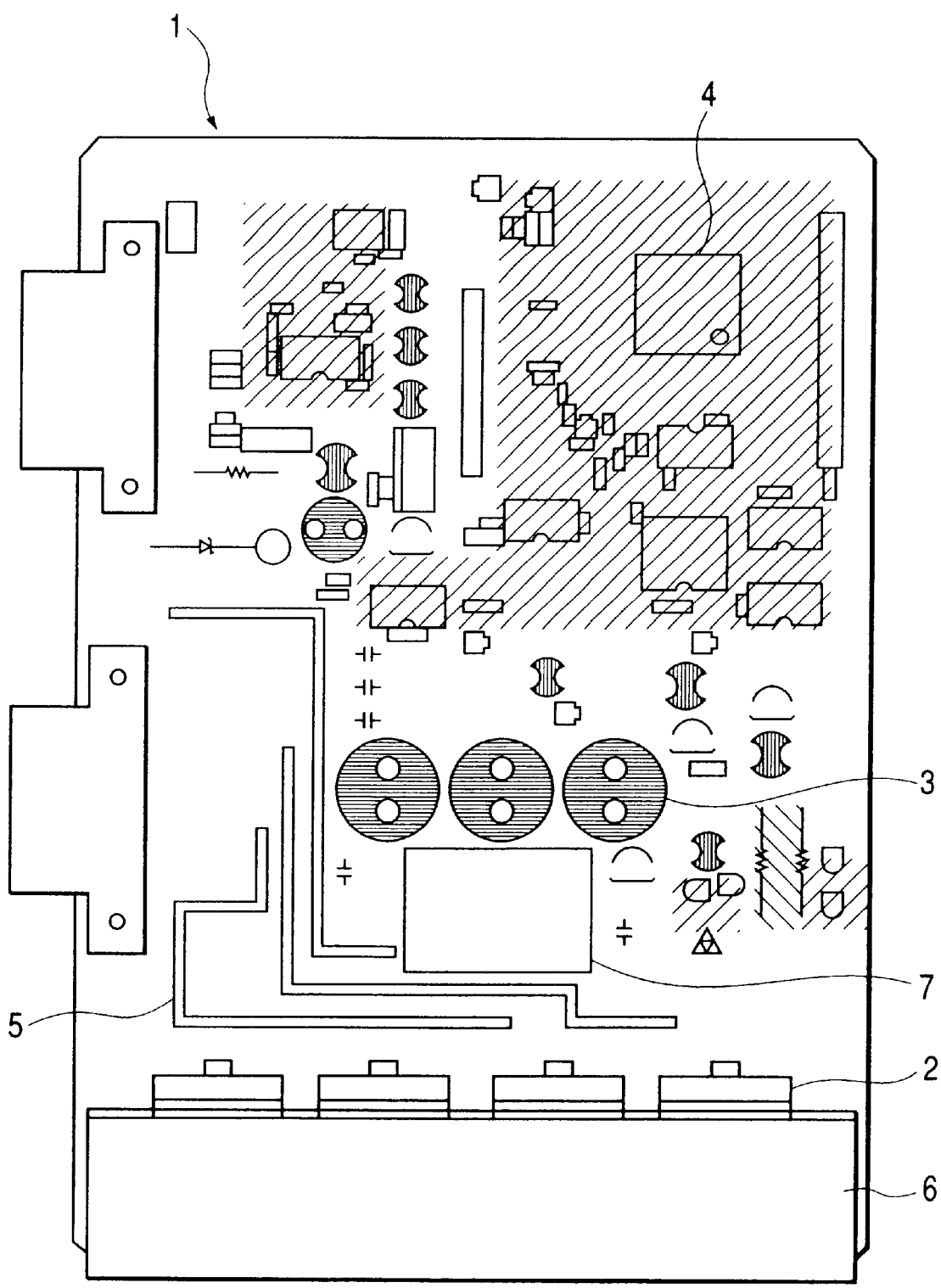
FIG. 6 is a plan view showing a circuit substrate of the control unit in prior art.

Referring first to FIG. 5, one embodiment of a hardware configuration (circuit configuration) in an electric power steering device will be described below. This device comprises an assist motor 11 (hereinafter simply referred to as a motor 11), a control circuit 13, a power circuit 15, and a torque sensor 16. The motor 11 generates a steering auxiliary torque and being connected to a steering system of the vehicle. The control circuit 13 controls the motor 11 via a drive circuit 12. The power circuit 15 supplies a predetermined electric power to this control circuit 13 from a power source (battery) 14 of the vehicle. The torque sensor 16 senses the steering torque of the steering system.

In FIG. 5, reference numeral 17 denotes an ignition switch of the vehicle, which functions to initiate the control circuit 13 in this device.

Also, reference numeral 18 denotes an electrolyte condenser for backing up the power source when an electric current of the motor 11 (hereinafter simply referred to as a motor current) is increased. Reference numeral 19 denotes a resistor connected to the ground side of the drive circuit 12, a voltage corresponding to an amount of voltage drop across this resistor 19 being input into the control circuit 13 via an input line 20. Since the voltage value input from the input line 20 is naturally proportional to a current value of the motor 11 (hereinafter simply referred to as a motor current value), the control circuit 13 can detect the motor current value from this voltage value, in which the resistor 19 and the input line 20 can constitute current detecting means 21 of the motor current.

Note that the drive circuit 12, the control circuit 13, the power circuit 15, and the electrolytic condenser 18 constitute a control unit 22 (hereinafter simply referred to as a unit 22) of the power steering device.

Herein, the drive circuit 12 consists of an H bridge circuit, as previously mentioned, and operates in accordance with a PWM drive signal output from the control circuit 13. This drive circuit 12 has a high potential power line 23 connected to a positive pole of the battery 14, and a low potential power line 24 connected to the ground, each coil terminal of the motor 11 being intermittently connected to the high potential power line 23 or the low potential power line 24 at a duty ratio according to the PWM drive signal by the operation of an FET (switching element), not shown, constituting the H bridge circuit.

The control circuit 13 consists of a circuit containing a microcomputer, and makes a control function for controlling the drive circuit 12 to produce a steering auxiliary torque according to a steering torque value found from a sensed signal of the torque sensor 16 by generating a PWM drive signal at a duty ratio to provide a motor current in accordance with the steering torque.

Also, the power circuit 15 transforms a voltage of the battery 14 (typically 12V to 14V) into a predetermined voltage (e.g., 5V) and supplies the predetermined voltage to the control circuit 13.

The unit 22, not shown, has a relay for opening or closing the high potential power line 23 under the control of the control circuit 13, and a ceramic condenser for countermeasure of the electric wave to suppress the noise emission, besides the above-cited elements.

One embodiment of a structure of the unit 22 will be described below.

Figure 1:
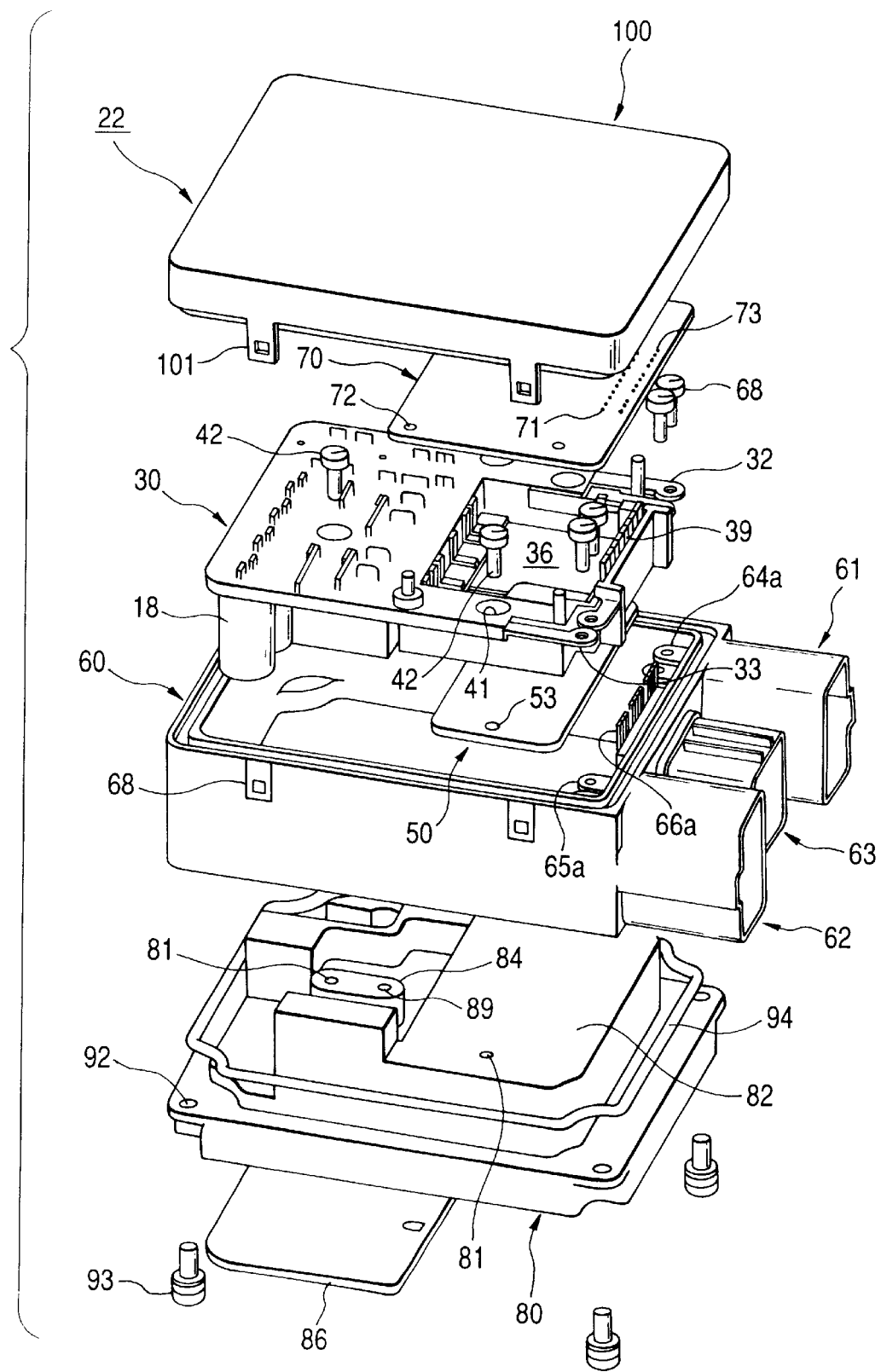
FIG. 1 is an exploded perspective view of a control unit.

FIG. 1 is an exploded perspective view of the unit 22. As shown in FIG. 1, the unit 22 of this embodiment comprises a baseboard 30, a metal substrate 50, a resin case 60, an insulating substrate 70, a heat radiating plate 80, and a cover member 100 as the main components. A schematic assembling procedure is as follows. That is, the metal substrate 50 is first attached on the baseboard 30, and then this intermediate assembly is incorporated into the resin case 60 that has mounted the heat radiating plate 80. Thereafter, the insulating substrate 70 and the cover member 100 are attached to complete an assembly.

These components will be described below in detail.

First of all, the baseboard 30 is a support board on which the metal substrate 50 and the insulating substrate 70 are attached one on another, as well as a circuit substrate for mounting the circuit parts (large current circuit components) such as the electrolytic condenser 18 (power back-up condenser) or the relay, through which a large current flows. This baseboard 30 has a circuit conductor constituent member 31 composed of a plurality of metallic fittings integrated into a resin base substance by insert molding, as shown in FIG. 2B, and can be configured as a whole as shown in FIG. 2A.

The circuit conductor constituent member 31 is made by press working (including cutting or bending) a plate member, and constitutes a circuit conductor having the electrolytic condenser 18 or the relay mounted by welding. The circuit conductor constituent member 31 also constitutes a conduction line (i.e., a wiring line between the drive circuit 12 and the motor 11) of the motor 11 through which a large current flows, and a power line (i.e., the high potential power line 23 or the low potential power line 24).

Figure 2A:
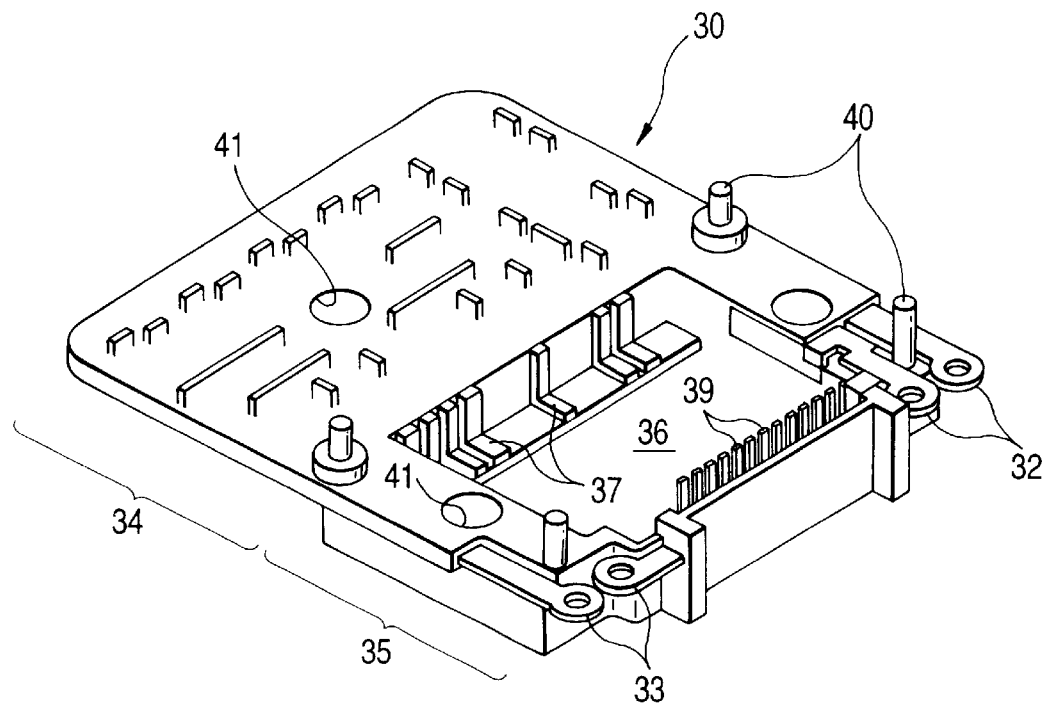
FIGS. 2A and B are respectively a perspective view for explaining a baseboard.
Figure 2B:
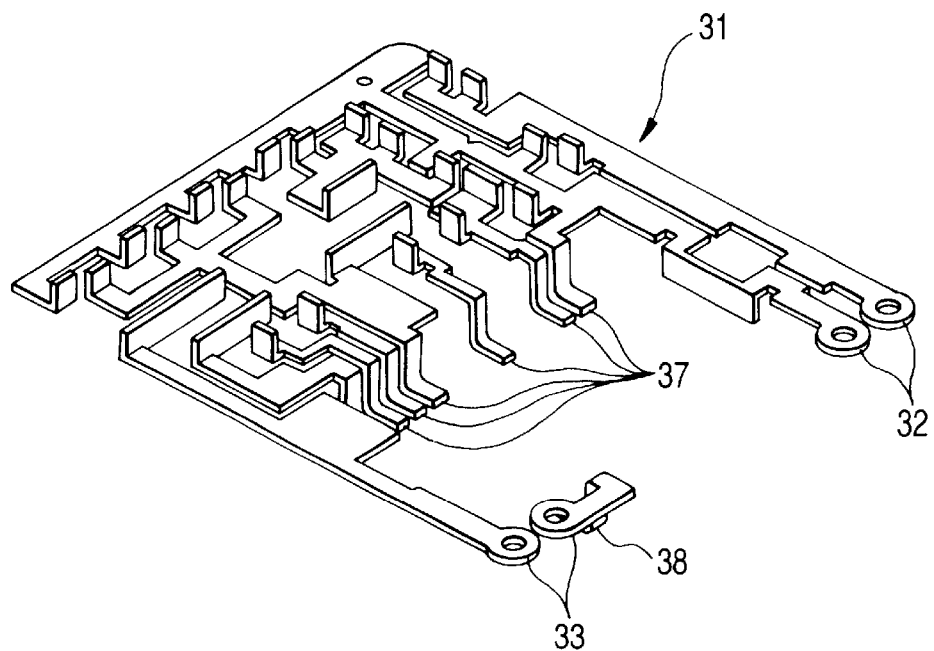

In FIGS. 2A and B, reference numeral 32 denotes a terminal formed on one end side of a region making up the power line of this circuit conductor constituent member 31, namely, a power connecting terminal that is connected to a positive or negative pole (or ground) of the battery 14. Also, reference numeral 33 denotes a terminal formed on one end side of a region making up the conduction line of this circuit conductor constituent member 31, namely, a motor connecting terminal that conducts to one of the coil terminals of the motor 11. Note that these terminals 32, 33 are of the screwed type, and joined and connected by the screw with the terminals 64a, 65a of the resin case 60, when attaching the baseboard 30.

The baseboard 30 includes a parts mounting area 34 and a substrate mounting area 35. The parts mounting area is about one-half of the total area on an opposite side (other side) to one end side where the terminals 32, 33 are provided. The substrate mounting area 35 is the remaining half portion (on one end side). The parts mounting area 34 is for mounting the parts such as the electrolytic condenser 18. The substrate mounting area 35 is for mounting the metal substrate 50 and the insulating substrate 70. In this case, the parts such as the electrolytic condenser 18 or the relay are welded on a lower face side of the parts mounting area 34, as shown in FIG. 2A. Of the parts mounted on the parts mounting area 34, particularly the electrolytic condenser 18 is disposed on the other endmost side at a position far away from the metal substrate 50, shown in FIG. 1.

Figure 4A:
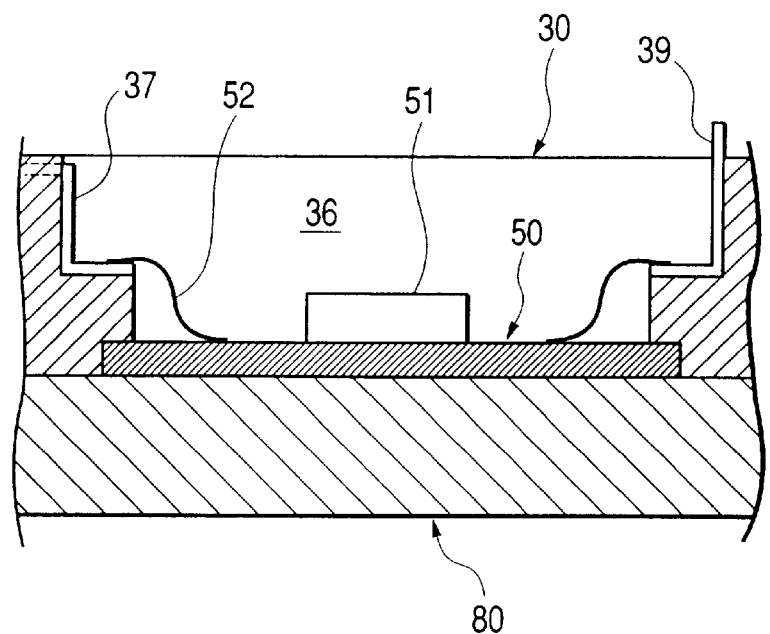
FIGS. 4A and B are respectively a partial cross-sectional view of a control unit.

And the substrate mounting area 35 is shaped like a frame inside having formed an opening 36 that opens on the upper and lower sides. In the opening 36, the metal substrate 50 is bonded on a lower face of the board by adhesive, for example, and the insulating substrate 70 is attached on an upper face thereof. Herein, the opening 36 exposes a circuit portion containing the drive circuit on the mounting face of the metal substrate 50 from the upper face side, as shown in FIG. 2A, to form a concave portion for filling the molding material so as to surround this circuit portion. In FIG. 2B, reference numerals 37 and 38 denote a plurality of electrodes (predetermined regions) formed as the pieces of the circuit conductor constituent member 31, and extending like an L character along an inside face of the opening 36. A predetermined region of the circuit conductor in the metal substrate 50 is connected to a predetermined region of the circuit conductor in the baseboard 30 (e.g., the conduction line or power line of the motor 11) via either of the terminals 37, 38. In this case, the connection between the electrode 37, 38 and the predetermined region of the circuit conductor in the metal substrate 50 is made by the so-called wire bonding. More specifically, an intermediate assembly having the metal substrate 50 bonded by adhesive on the lower face of the opening 36 in the baseboard 30 is supplied to a wire bonding installation for the connecting operation. In this case, the baseboard 30 is substantially a sheet as a whole, and can be connected through a common wire bonding process for mounting the IC chips on the ordinary printed board by wire bonding. FIG. 4A is an enlarged longitudinal cross-sectional view of an attaching portion of the metal substrate 50. In FIG. 4A, reference numeral 51 denotes a mounted part (e.g., an FET) on the metal substrate 50, and reference numeral 52 denotes a wire formed by wire bonding.

In FIG. 2A, reference numeral 39 denotes a terminal formed at an upper end of each of a plurality of L-character fittings (press worked members) integrally buried into the baseboard 30 by insert molding, like the circuit conductor constituent member 31. Each of these terminals 39 serves to make connection between a predetermined circuit conductor of the insulating substrate 70 and a predetermined circuit conductor of the metal substrate 50. On the lower end of each of the fittings making up these terminals 39, an electrode is formed to extend like an L character along the inside face of the opening 36 (see FIG. 4A), and connected to a predetermined circuit conductor of the metal substrate 50 by wire bonding, in the same manner as the electrodes 37, 38. However, the circuit conductors connected to the terminals of the fittings serve to send a control signal from the control circuit on the insulating substrate to the drive circuit 12 on the metal substrate 50. Since this circuit conductor is usable for a weak electric circuit through which a large current does not flow, the fittings making up the terminals 39 are relatively thin, and narrow in width in cross section. In this connection, the fittings constituting the circuit conductor constituent member 31 are on the contrary thick enough to pass a large current.

Note that the terminals 39 are so-called press fit terminals that can be fit into the through holes 71 (as shown in FIG. 1) of the insulating substrate 70 in attaching the insulating substrate 70. In the press fit state, the outside periphery of each of the terminals 39 is resiliently pressed onto the inside face of each of the through holes 71, or the surface of the conductor located nearby, to secure a conducting state. Note that the through holes 71 are through type terminals for leading the terminals 39 to the predetermined locations of the circuit conductor on the insulating substrate 70.

After the connection between all the electrodes within the opening 36 and the predetermined regions of the circuit conductor in the metal substrate 50 is completed by wire bonding, a predefined amount of molding material (e.g., epoxy resin) is poured into a concave portion formed by the opening 36 and the mounting surface of the metal substrate 50, and then the molding material is cured by heating to provide a molded structure for the mounting surface of the metal substrate 50.

In FIG. 2A, reference numeral 40 denotes a projection for the so-called snap fit formed at each of four positions around the opening 36. Note that this projection 40 is insertable into a through hole 72 (as shown in FIG. 1) formed at each of four corners of the insulating substrate 70, the top end portion contracted in diameter at the time of insertion is expanded in diameter after penetration and engaged into the through hole 72, whereby the insulating substrate 70 can be attached by one touch. In this connection, means for coupling the members by one touch through such resilient engagement is typically called a snap fit. In this case, press fitting the terminal 39 into the through hole 71, or a terminal 66a into a through hole 73 can be performed at the same time of inserting this projection 40. That is, the insertion or press fitting operation can be fully implemented by the same operation of the insulating substrate 70 (i.e., the insulating substrate 70 is positioned, and descended, while being carried horizontally, to be pressed onto the baseboard 30 in FIG. 1). With this operation, attaching the insulating substrate 70 and its electrical connection can be completed by one touch.

In FIG. 2A, reference numeral 41 denotes a plurality of through holes (provided at three positions in this case) for inserting a screw member 42 (as shown in FIG. 1) into the baseboard 30. When this screw member 42 is inserted into the through hole 41 and screwed into a corresponding screw hole 81 (as shown in FIG. 1) of a heat radiating plate 80, the baseboard 30 having the metal substrate 50 attached is secured with the heat radiating plate 80 and the resin case 60. Note that the metal substrate 50 is sandwiched between the baseboard 30 and the heat radiating plate 80 by tightening this screw member 42, so that the back face of the metal substrate 50 is brought into press contact with a concave face section 82 of the heat radiating plate 80 as will be described later.

The metal substrate 50 will be described below. The metal substrate 50 is produced in such a way as to form an insulating layer on the surface of an aluminum plate (on the mounting face side) that is a base substance, to form a wiring pattern as the circuit conductor on the insulating layer by printed wiring technique, and to mount the parts such as an FET making up the drive circuit 12 on the predetermined positions of this wiring pattern. Note that the upper face is the mounting face of this metal substrate 50 in FIG. 1.

Note that this metal substrate 50 is bonded with the baseboard 30 by adhesive, and connected by wire bonding, as previously described. In FIG. 1, reference numeral 53 denotes a through hole formed at each of two positions corresponding to two through holes 41 and through which the screw member 42 is inserted.

The resin case 60 will be described below.

Figure 3A:
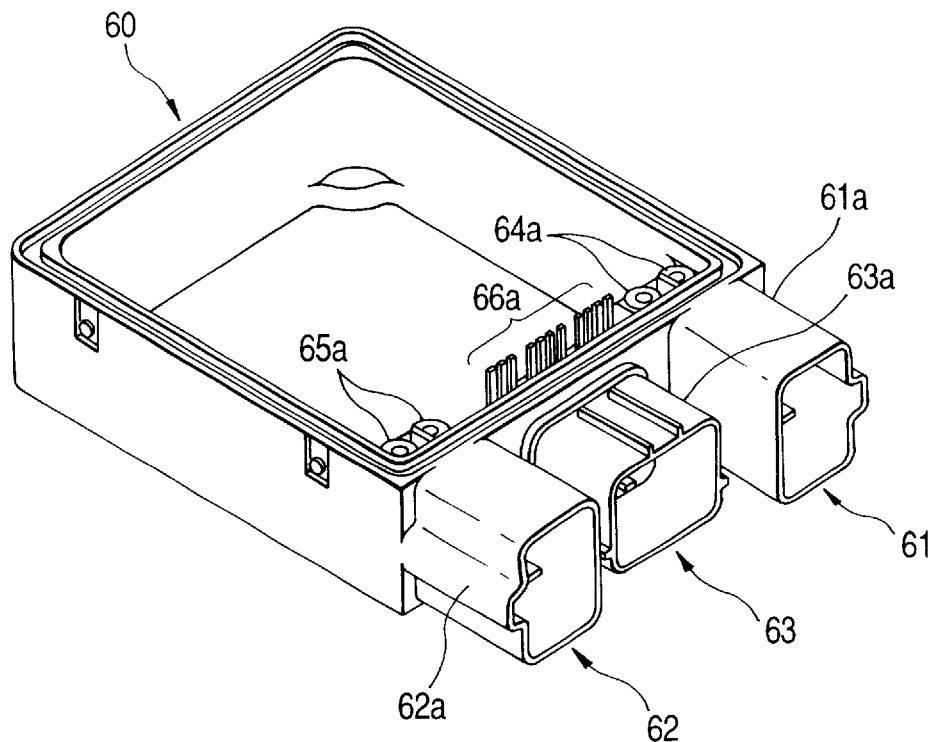
FIGS. 3A and B are respectively a perspective view for explaining a resin case.

The resin case 60 is shaped like a frame as a whole to accommodate the baseboard 30, and is a member for constituting an outside wall on the side face of the unit 22, and provided integrally with the connectors 61, 62, 63 for the outside wiring, as shown in FIG. 3A. Herein, it is noted that a connector 61 is connected to the power supply wiring containing a power supply line to the positive pole of the battery 14, a connector 62 is connected to the conduction line wiring to each coil terminal of the motor 11, and a connector 63 is connected to various kinds of signal line (i.e., the signal line for inputting or outputting the signals of the control circuit 13 into or from the outside of the unit) such as an ignition switch (start switch 17) or the torque sensor 16.

Figure 3B:
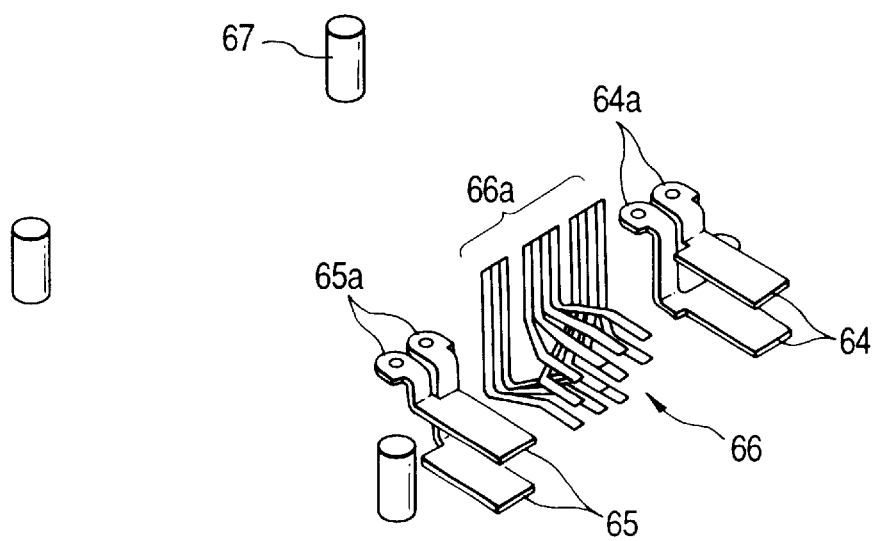

This resin case 60 has the electrode components 64, 65, 66 composed of a plurality of metallic fittings, and a plurality of screw hole components 67, which are integrated with the resin base substance by insert molding, as shown in FIG. 3B.

The electrode components 64, 65 and 66 are produced by press working (including cutting or bending) a plate member, with one end side serving as the terminal 64a, 65a and 66a for connection, and the other end side being an electrode for each connector. Herein, the electrode component 64 constitutes an electrode of the connector 61, the electrode component 65 constitutes an electrode of the connector 62, and the electrode component 66 constitutes an electrode of the connector 63. Note that each of the electrode components 64, 65, like the electrode component 31 as previously described, is relatively thick, because a large current flows through it, while the electrode component 66, like the terminal 39 as previously described, is relatively thin, because no large current flows through it.

The terminals 64a, 65a formed at one ends of the electrode components 64, 65 are those for screw connection. The terminals 64a, 65a are engaged with the lower faces of the terminals 32, 33 in the state where the baseboard 30 is attached on the resin case 60, and then screwed into the terminals 32, 33 by four screw members 68, respectively, as shown in FIG. 1.

The terminal 66a formed at one end of the electrode component 66 is a press fit terminal, and can be fitted into the through hole 73 (as shown in FIG. 1) of the insulating substrate 70 in attaching the insulating substrate 70. In the fitted state, the outside periphery of the terminal is resiliently pressed onto the inside periphery of the through hole or the conductor face nearby, to secure a conducting state. Note that the through hole 73 is a through type terminal for leading each terminal 66a to a predetermined region of the circuit conductor on the insulating substrate 70, and is arranged in two rows along with the through hole 71 on one side of the insulating substrate 70.

The screw hole component 67 is disposed at each of four corners of the resin case 60 (three screw hole components are only shown in FIG. 3B, but in practice four screw hole components are provided), and buried into the resin case 60 by insert molding to constitute a screw hole for screwing a screw member 93 into the heat radiating plate 80.

Note that the connectors 61, 62, 63 are male type connectors, and the other end sides of the electrode components 64, 65, 66 are placed as the electrodes within the barrel-shaped connector plugs 61a, 62a, 63a formed integrally on one side face of the resin case 60 as the pieces of the resin case 60. And the female connectors for the outside wiring can be mated with the connector plugs 61a, 62a, 63a, whereby the corresponding electrodes of the male and female connectors conduct with each other in this attached state.

The insulating substrate 70 will be described below.

The insulating substrate 70 is produced by forming a predetermined wiring pattern on a substrate made of e.g. synthetic resin by printed wiring technique, and mounting the circuit components (e.g., a microcomputer or transistors for the input/output circuit) making up the control circuit 13, and fundamentally is the same configuration as the typical printed board.

On one side face of this insulating substrate 70 (where the connectors 61, 62, 63 are provided), the through holes 71, 73 are formed in two rows, and at four corners, the through hole 72 is formed.

Also, the insulating substrate 70 is attached by one touch to the baseboard 30 incorporated into the resin case 60, the electrical connection being effected by engagement between the through holes 71, 73 and the terminals 39, 66a (press fit terminals).

The mounting face of this insulating substrate 70 for mounting the circuit components are an inside face (or a lower face in FIG. 1), the circuit components on the insulating substrate 70 being arranged within the opening 36 of the baseboard 30. Therefore, all the circuit components mounted on any of the baseboard 30, the metal substrate 50, and the insulating substrate 70 are accommodated within a space in a thickness direction where the baseboard 30 and the large parts mounted thereon (e.g., the electrolytic condenser 18) are disposed. Further, the whole unit 22 in the thickness direction (or vertical direction in FIG. 1) is almost equivalent in size to the space in the thickness direction where the baseboard 30 and the large parts mounted thereon are disposed, in addition to a relatively small thickness of the heat radiating plate 80, and a slight thickness of the cover member 100.

The heat radiating plate 80 will be described below.

The heat radiating plate 80 is fabricated by die casting aluminum, in which a convex face portion 82 jutting out to the inside face and pressed onto a back face of the metal substrate 50 is formed on one side (or the right side in FIG. 1) corresponding to the side where the metal substrate 50 is placed. On the other side (or the left side in FIG. 1) of this heat radiating plate 80, a convex portion 84 formed internally with a vent channel 83 (as shown in FIG. 4B) is formed to extend inside to avoid the interference with the parts such as the electrolytic condenser 18 mounted on the baseboard 30.

Figure 4B:
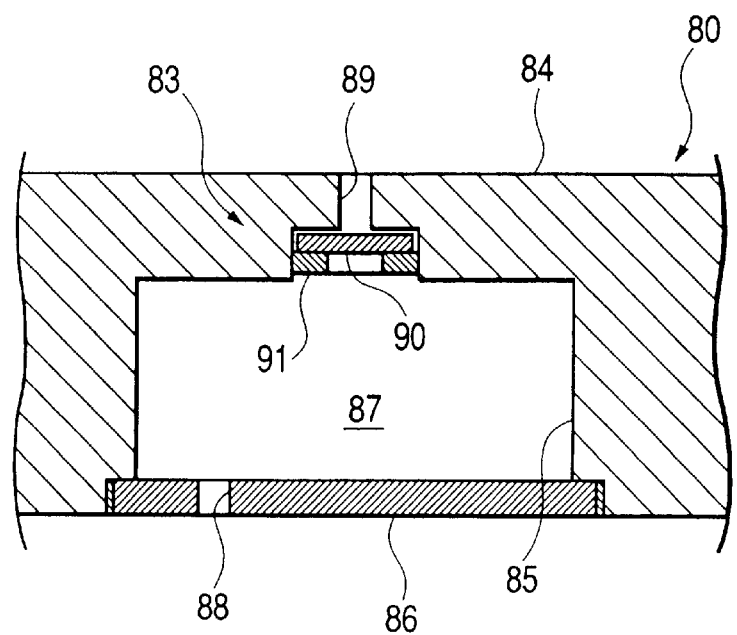

Herein, the vent channel 83 is composed of a breather space 87, an outside vent hole 88, and an inside vent hole 89, as shown in FIG. 4B. The breather space 87 has a convex portion 85 formed on an outside face of the heat radiating plate 80 closed by a breather cover 86. The outside vent hole 88 is a small diameter through hole formed on the breather cover 86. The inside vent hole 89 is a small diameter through hole to reach the inside face (within the unit) of the heat radiating plate 80 extending from the concave portion 85. At an entrance of the inside vent hole 89 (an opening of the concave portion 85), a step (without reference numeral) is formed, as shown in FIG. 4B. This step is secured with a filter 90 to enclose the entrance of the inside vent hole 89 by a pressure sensitive adhesive double coated tape. On a back face side of the filter 90 at this step, a collar 91 that is a ring metallic fixture is fitted to surely prevent the filter 90 from peeling or falling.

The filter 90 is made of a material capable of permeating the air, and has a function of blocking the water or foreign matter from entering the unit. Also, the outside vent hole 88 is a through hole for communicating the breather space 89 to the outside of the unit with a minuter cross section than the breather space 87. Herein, a "minute cross section" means a flow path cross section which is so minute that a pressure difference between the inside and the outside of the unit is sufficiently reduced, because when the unit is covered with water, a large quantity of water entering through the outside vent hole 88 is filled in the breather space to enclose the inside vent hole 89 (on the surface of the filter 90 on the side of the breather space 87), while the air within the breather space is brought via the filter 90 and the inside vent hole 89 into the inside of the unit, as required. The breather space has a sufficient capacity for that. That is, if the unit 22 is mounted on the vehicle so that the lower direction is vertically down, in FIG. 4B, the air may possibly remain within the breather space 89 owing to the action of a gravity force, when the unit is covered with water. However, the air within the breather space 87 may escape gradually, depending the attitude of mounting the unit 22 or the inclined state of the vehicle, when the unit is covered with water, bringing about the danger that the breather space 87 is ultimately filled with a quantity of water. Even when such a worst situation occurs, the rate of the water entering through the outside vent hole 88 (or the rate of the air escaping through the outside vent hole 88) is so slowed that the air within the breather space 87 is brought into the unit, as required, to relieve a pressure difference between the inside and the outside of the unit, until the breather space 87 is filled with a quantity of water.

The breather cover 86 is a plate-shaped member made of a synthetic material to be fitted into a step portion (without reference numeral) formed in the opening of the concave portion 85 in the heat radiating plate 80, and attached on the heat radiating plate-80 in a sealed state at the peripheral portion by bonding the peripheral portion to this step portion using an adhesive.

In FIG. 1, reference numeral 92 denotes a through hole for inserting a screw member 93 and being formed at each of four corners of the heat radiating plate 80, the screw member 93 being inserted through the through hole 92 and screwed into a screw hole corresponding to the resin case 60 (screw hole of the screw hole constituent fitting 67), so that the heat radiating plate 80 is attached on the resin case 60 to enclose one face side of the resin case 60 (or the lower face side in FIG. 1). In FIG. 1, reference numeral 94 denotes an O-ring interposed between a peripheral inside face of the heat radiating plate 80 and the resin case 60, this O-ring 94 being appropriately squeezed to some extent by tightening this screw member 93 to seal the peripheral inside face of the heat radiating plate 80 and the resin case 60 reliably.

The cover member 100 will be described below.

The cover member 100 is made of a synthetic material, and attached on the resin case 60 to close an opening on the opposite side (or the upper face side in FIG. 1) of the heat radiating plate 80 of the resin case 60 where the baseboard 30 or the insulating substrate 70 is attached. At each of four positions on the peripheral edges of the cover member 100, a flexible projection piece 101 extends to the resin case 60, as an element making the snap fit. On the other hand, at each of corresponding four positions on the outer peripheries of the resin case 60, a concave portion 68 into which this projection piece Ls fitted is formed. And a projected or recessed portion (without reference numeral) formed inside at the top end of the projection piece 101 is resiliently engaged with a projected or recessed portion (without reference numeral) formed on the concave portion 68 of the resin case 60, so that the cover member 100 is attached by one touch on the resin case 60. The peripheral end face of the cover member 100 and the peripheral end of the resin case 60 are bonded all over the peripheral edges in the attached state, by applying an adhesive on the attached portion to effect the so-called adhesive seal.

With the structure of the unit 22 as described above, the following effects that are favorable in practice can be provided.

(1) In the unit 22, the circuits or parts are mounted on the optimal substrate for each function, each substrate being laminated on the baseboard 30. Therefore, the unit 22 can be significantly reduced in size, and mounted on the vehicle more excellently.

That is, the drive circuit 12 containing a switching element for PWM driving the assist motor 11 and having a quantity of generated heat is first mounted on the metal substrate 50 having excellent heat conductivity to secure high heat radiation property. Thereby, the width or interval of a wiring pattern on the metal substrate 50 constituting a circuit conductor of this drive circuit 12 can be set to be narrower than the prior art, resulting in reduced area of the mounting portion of the drive circuit 12 or reduced overall area of the metal substrate 12.

The control circuit 13 having smaller current flowing is mounted on the ordinary insulating substrate 70, and can be disposed within a minimum of area.

And the large current circuit component containing the electrolytic condenser 18 (power back-up condenser) is mounted on the baseboard 30 having the circuit conductor constituted by insert molding a metallic member (in this case, a fitting making up the circuit conductor constituent member 31 or the terminal 39). Namely, the circuit conductor for passing a large current, which was constituted of a bus bar on the insulating substrate in prior art, is formed integrally with the resin substrate in the baseboard 30 by insert molding the metallic member. Therefore, by increasing the set thickness of this metallic member, the capacity (cross section) of the circuit conductor for passing a large current is sufficiently secured, while the size of the circuit conductor in a plane direction is suppressed to the small value, and the space of disposing the mounting portion of the large current circuit component in a thickness direction can be reduced by an amount of the circuit conductor buried into the baseboard 30 by insert molding, as compared with where the bus bar is provided on the substrate.

Further, the metal substrate 50 and the insulating substrate 70 are laminated on the baseboard 30, resulting in reduced size of the unit in the plane direction as a whole.

Accordingly, the size of the unit 22 in the plane direction (or the horizontal direction in FIG. 1) can be reduced in large quantity, and the size of the unit 22 in a thickness direction (or the vertical direction in FIG. 1) can be made below the size in the prior art, and correspondingly the weight can be decreased. Therefore, for the relatively large vehicle shaving a great amount of current passing through the assist motor 11, the unit 22 can exhibit enhanced applicability or on-board capability in the respects of the space and weight.

(2) The unit 22 is equipped with the heat radiating plate 80 disposed to constitute an outside wall on the lower face side in FIG. 1, an inside face of this heat radiating plate 80 being joined with a back face of the metal substrate 50.

Therefore, the high ability for radiating the heat generated in the drive circuit 12 is secured, while avoiding the increased number of parts. Moreover, there is the advantage that the attaching of the baseboard 30 to the metal substrate 50 and its electrical connection can be facilitated. This is because as the unit 22 is of the structure that the heat radiating plate 80 constitutes an outside wall, there is no need of having the cover member making up the outside wall of a portion where the heat radiating plate 80 is provided, and further as the outer face of the heat radiating plate 80 is exposed to the outer atmosphere, the high heat radiation ability can be obtained. Though the metal substrate 50 itself can function as the heat radiating plate, the metal substrate 50 itself is required to be a size or shape having a considerable heat radiation area. However, in this case, it is apprehended that the attaching of the metal substrate 50 to the baseboard 30 or its electrical connection can not be facilitated. If the heat radiating plate 80 and the metal substrate 50 are separated, such a problem does not arise.

(3) In the unit 22, the electrode of the large current circuit component (e.g., electrolytic condenser 18) is connected to a predetermined region of the circuit conductor constituent member 31 in the baseboard 30 by welding.

Therefore, a large current flows through the large current circuit component, and even when its connected portion is heated, there is possibly no inconvenience such as solder melting, whereby the large current circuit component can have a high reliability of connection. Accordingly, the applicability of the device to the large vehicles can be also enhanced in the aspect of the reliability of connecting the large current circuit component.

(4) The unit 22 is equipped with the frame-shaped resin case 60 disposed to surround the baseboard 30 and constituting an outside wall of the side face of the unit 22, the baseboard 30 being substantially a sheet and attached within this resin case 60.

Therefore, the mounting operation of the large current circuit component on the baseboard 30 can be facilitated, and the baseboard 30 and the outside wall surrounding its baseboard 30 can be manufactured more easily. This is because a wall face portion to make an outside wall is formed integrally on the outer peripheral portion of the baseboard 30, for example, but in this case the baseboard 30 is not simply a plate-shaped member, and peripherally surrounded by the wall face portion, which may impede the operation, making it difficult to attach or connect the large current circuit component mechanically to give rise to the high costs. Also, the baseboard 30 itself is relatively difficult to manufacture. However, with the above constitution, such problem can be eliminated. Accordingly, the manufacturing costs can be reduced, and the applicability of the device to the large vehicles can be also enhanced in the aspect of the manufacturing costs.

(5) The unit 22 is provided with the connectors 61, 62, 63 for the outside wiring on one side of the resin case 60. A predetermined electrode of each of these connectors (each electrode of the connector 61, 62 in this case) and a predetermined region of the circuit conductor constituent member 31 in the baseboard 30 are connected by screwing the terminals that mate each other (terminals 64a, 65a and terminals 32, 33).

Therefore, there is no inconvenience such as the false contact due to so-called welded flag or solder ball when the welding or soldering is effected, resulting in higher operation reliability. There is the advantage that the operation of connecting the circuit conductor of the large current circuit component (the circuit conductor of the baseboard 30) with the connectors 61, 62 can be facilitated.

(6) In the unit 22, the terminals (terminals 39, 66a, and through holes 71, 73 that are paired with the terminals) for connecting a predetermined electrode of the connector 63 and a predetermined region of the circuit conductor constituent member in the baseboard 30 (fitting making up the terminal 39) to a predetermined circuit conductor of the insulating substrate are disposed on one side (or the right end side in FIG. 1) of the insulating substrate 70.

Therefore, the circuit connection of the metal substrate to the insulating substrate 70 where the control circuit 13 is mounted (i.e., the connection of circuits through which no large current flows, or mainly the connection of signal line) is all effected on one side of the unit 22. Therefore, the operation of incorporating insulating substrate 70 (including fitting the terminals 39, 66a that are press fit terminals into the through holes 71, 73) can be mechanically implemented.

(7) In the unit 22, the connection of a predetermined electrode of the connector 63 and a predetermined region (or a fitting making up the terminal 39) of the circuit conductor constituent member in the baseboard 30 with a predetermined circuit conductor of the insulating substrate 70 is effected by one terminal (terminal 39, 66a) provided on a surface (or an upper face in FIG. 1) opposed to the resin case 60 and the insulating substrate 70 in the baseboard 30, and the other terminal (through hole 71, 73) that can be engaged with the one terminal upon an operation of attaching the insulating substrate 70 on the baseboard 60, the other terminal provided on a face (or a lower face in FIG. 1) opposed to the resin case 70 of the insulating substrate 70 and the baseboard 30.

Therefore, an intermediate subassembly composed of the baseboard 30 and the resin case 60 is first built, and then the insulating substrate 70 is attached to the baseboard 30, while the terminals on both sides are engaged or joined, and the terminals are soldered together, as required. Then, the assembling of the baseboard 30, the resin case 60 and the insulating substrate 70 is completed, and at the same time the electrical connection of the insulating substrate 70 to the baseboard and the resin case 60 (connector) can be performed. This enhances the assembling capability of the unit. In this case, since the metal substrate 50 is incorporated beforehand into the baseboard 30, and its electrical connection is completed, all the assembling of the metal substrate 50, the baseboard 30, the resin case 60 and the insulating substrate 70, and its 20 electrical connection, can be completed more easily.

(8) In the unit 22, the connector 61, 62, 63 comprises a fitting portion 61a, 62a, 63a formed integrally with the resin case 60 and into which another connector is fitted, and an electrode (electrode component 64, 65, 66) provided integrally 25 in the resin case 60 by insert molding.

Therefore, it is possible to surely prevent the inconvenience such as the fitting portion 61a, 62a, 63a being unsteady or dislocated. Thereby the operation of inserting or extracting the connector 61, 62, 63 (connector on the unit side) into or out of another connector (on the outside device side) can be effected stably. Also, the number of parts can be decreased as compared with when the connectors 61, 62, 63 are provided as separate parts.

(9) In the unit 22, an opening 36 for exposing at least a mounting surface of the metal substrate 50 on a side of the baseboard 30 (or an upper side) opposite to a side where the metal substrate 50 is attached is formed at a position where the metal substrate 50 is attached, an inner surface of the opening 36 surrounding the mounting surface of the metal substrate 50 to form a concave portion for filling the molding material.

Therefore, by pouring and fixing a predefined amount of molding material (e.g., epoxy resin) into the concave portion, the mounting surface of the metal substrate 50 formed with a circuit containing at least the drive circuit 12 can be molded easily and excellently.

(10) In the unit 22, a predetermined region of the circuit conductor constituent member of the baseboard 30 and a predetermined circuit conductor of the metal substrate 50 are connected by wire bonding.

Therefore, in contrast to the structure in which the terminals are stood from the metal substrate 50, and connected with the baseboard 30 by soldering or welding, there is no problem with the solder ball or welding flag, resulting in higher reliability. The operation of connecting the metal substrate 50 can be effected with higher productivity in mass production. Also, the space required for the connecting portion of the metal substrate 50 can be reduced, thereby contributing to the smaller and enhanced on-board unit for the vehicles.

(11) The unit 22 further comprises an insulating cover member 100 as an outside wall covering at least an opposite side (an upper face in FIG. 1) of a face where the metal substrate 50 of the baseboard 30 is attached.

Therefore, there is no need of securing a predefined distance for insulation between the circuit components or circuit conductor within the unit and the outside wall, so that the outside wall can be disposed more inside (i.e., the cover member 100 can be placed at a lower position in FIG. 1), thereby contributing to the smaller and enhanced on-board unit for the vehicles.

(12) In the unit 22, the sealing for an attaching portion of the cover member 100 is made by an adhesive seal.

Therefore, though the insulating cover member 100 is employed as the outside wall, and further reduced in size, the attaching portion of this cover member 100 can be sealed with high reliability, making it possible to secure high water resistance of the unit.

(13) In the unit 22, a mounting portion (parts mounting area 34) of the baseboard 30 where a large current circuit component containing at least an electrolytic condenser 18 (power back-up capacitor) is mounted is disposed not to overlap the insulating substrate 70 and the metal substrate 50.

Therefore, a situation can be avoided in which the unit 22 is increased in size in a thickness direction because the large current circuit component having relatively large parts and the insulating substrate 70 are overlapped. Hence, even though a plurality of substrates 30, 50, 70 are laminated, the size of the unit 22 in the thickness direction is kept small, resulting in the smaller and enhanced on-board unit 22 for the vehicle.

(14) In the unit 22, the electrolytic condenser 18 (power back-up capacitor) is disposed on one end side (or the left end in FIG. 1) of the baseboard 30, and the metal substrate is disposed on the other end side (or the right end in FIG. 1) of the baseboard 30.

Therefore, a quantity of heat radiated from the metal substrate 50 is suppressed to conduct to the electrolytic condenser 18, resulting in higher reliability or longer life of the electrolytic condenser 18 that is weak to the heat, thereby contributing to the higher reliability or longer life of the whole unit.

(15) In the unit 22, a vent channel 83 allowing the ventilation of the air into and out of the unit is formed in a heat radiating plate 80 constituting an outside wall of the unit, the vent channel 83 comprising a breather space 87 partitioned from the inside of the unit, an outside vent hole 88 for communicating the breather space 87 to the outside of the unit with a smaller cross sectional area than that of the breather space 87, and an inside vent hole 89 for communicating the breather space 87 into the unit, and the inside vent hole 89 is fitted with a filter 90 porous to air but impervious to water.

Therefore, with the action as previously described, the internal pressure within the unit is prevented from decreasing below (at least excessively below) the external pressure owing to the drop in internal pressure caused by cooling when the unit 22 is covered with water, or owing to a water pressure by submersion under water. The water resistance can be kept cheaply and reliably from degrading owing to pressure difference between the inside and the outside of the unit.

According to the present invention, there is provided a control unit for an electric power steering device that uses an assist motor linked to a steering system of a vehicle to generate a steering auxiliary torque, comprising:

a drive circuit containing a switching element for switching the connection of each coil terminal of the assist motor to a high potential power line or a low potential power line;

a control circuit for controlling the operation of the assist motor by controlling the operation of the switching element of the drive circuit;

a large current circuit component containing a power back-up capacitor connected to the high potential power line;

a metal substrate made of a metal and having the drive circuit mounted;

an insulating substrate made of an insulating material and having the control circuit mounted; and a baseboard having a metallic circuit conductor constituent member integrated with a resin substance by insert molding and the large current circuit component mounted;

wherein the metal substrate and the insulating substrate are attached on the baseboard to overlap each other.

With this invention, the circuits or parts are mounted on the optimal substrate for each function, each substrate being laminated on the baseboard. Therefore, the unit can be significantly reduced in size, and mounted on the vehicle more excellently.

That is, the drive circuit containing a switching element for switching the conduction state of the assist motor and having a quantity of generated heat is first mounted on the metal substrate having excellent heat conductivity to secure high heat radiation property. Thereby, the width or interval of a wiring pattern on the metal substrate constituting a circuit conductor of this drive circuit can be set to be narrower than conventionally, resulting in reduced area of the mounting portion of the drive circuit or reduced overall area of the metal substrate.

The control circuit having smaller current flowing is mounted on the ordinary insulating substrate, and can be disposed within a minimum of area.

And the large current circuit component containing the power back-up condenser is mounted on the baseboard having the circuit conductor constituted by insert molding a metallic member. Namely, the circuit conductor for passing a large current, which was conventionally constituted of a bus bar on the insulating substrate, is formed integrally with the resin substrate in the baseboard by insert molding the metallic member. Therefore, by increasing the set thickness of this metallic member, the capacity (cross section) of the circuit conductor for passing a large current is sufficiently secured, while the size of the circuit conductor in a plane direction is suppressed to the small value, and the space of disposing the mounting portion of the large current circuit component in a thickness direction can be reduced by an amount of the circuit conductor buried into the baseboard by insert molding, as compared with where the bus bar is provided on the substrate.

Further, the metal substrate and the insulating substrate are laminated on the baseboard, resulting in reduced size of the unit in the plane direction as a whole.

Accordingly, the size of the unit in the plane direction can be reduced in large quantity, and the size of the unit in a thickness direction can be made below the conventional size, and correspondingly the weight can be decreased. Therefore, for the relatively large vehicles having a more amount of current passing through the assist motor, the unit can exhibit the enhanced applicability or on-board capability in the respects of the space and weight.

The control unit for the electric power steering device of this invention, or the control unit mounted on the vehicle, comprises a vent channel allowing the ventilation of the air into and out of the unit formed in any member constituting an outside wall of the unit, the vent channel comprising a breather space partitioned from the inside of the unit, an outside vent hole for communicating the breather space to the outside of the unit with a smaller cross sectional area than that of the breather space, and an inside vent hole for communicating the breather space into the unit, wherein the inside vent hole is fitted with a filter porous to air but impervious to water.

Therefore, when the unit is covered with water, the air remaining within the breather space passes through the filter and the inside vent hole into the inside of the unit, whereby the pressure difference between the inside and the outside of the unit can be fully resolved. Accordingly, the internal pressure within the unit is prevented from dropping (or at least excessively below) below the external pressure owing to a reduction in inner pressure or a water pressure by submersion under water due to the cooling, for example, when the unit is covered with water, and the water resistance can be maintained at any time inexpensively and reliably.

What is claimed is:

1. A control unit for an electric power steering device having an assist motor linked to a steering system of a vehicle to generate a steering auxiliary torque, said control unit comprising:
    a drive circuit having a switching element for switching a connection of each coil terminal of said assist motor to a high potential power line or a low potential power line;
    a control circuit for controlling an operation of said switching element of said drive circuit to control an operation of said assist motor;
    a large current circuit component containing a power back-up capacitor connected to the high potential power line;
    a metal substrate having said drive circuit mounted on one surface thereof;
    an insulating substrate having said control circuit mounted on one surface thereof; and
    a baseboard having a metallic circuit conductor constituent member integrated with a resin base substance by insert molding and having said large current circuit component mounted;
    wherein said metal substrate and said insulating substrate are attached on said baseboard to overlap each other.

2. The control unit according to claim 1, further comprising:
    a heat radiating plate for radiating a heat of said drive circuit, one surface of said heat radiating plate being bonded with the other surface of said metal substrate, the other surface of said heat radiating plate forming an outside wall of said control unit.

3. The control unit according to claim 1, wherein an electrode of said large current circuit component is welded to a predetermined region of said circuit conductor constituent member of said baseboard.

4. The control unit according to claim 1, further comprising:
    a frame-shaped resin case for accommodating said baseboard within said resin case and forming an outside side wall of said control unit.

5. The control unit according to claim 1, wherein said baseboard is substantially flat.

6. The control unit according to claim 4, wherein said resin case has a connector for an outside wiring of the control unit, a terminal of an electrode of said connector being connected with a terminal of said circuit conductor constituent member of said baseboard with a screw.

7. The control unit according to claim 4, wherein said resin case has a connector for an outside wiring of said control unit, said connector has a first terminal of an electrode thereof, said baseboard has a second terminal of said circuit conductor constituent member, and said insulating substrate has a third terminal of said control circuit, the first, second and third terminals being disposed on one side of said insulating substrate.

8. The control unit according to claim 4, wherein said resin case has a connector for an outside wiring of said control unit, said resin case has a first terminal provided on one surface opposed to said insulating substrate, said baseboard has a second terminal provided on one surface opposed to said insulating substrate, and said insulating substrate has a third terminal provided on the one surface opposed to said resin case and said baseboard, the third terminal being engaged or joined with said first and second terminals by attaching said insulating substrate on said baseboard.

9. The control unit according to claim 4, wherein said resin case has a connector for an outside wiring of said control unit, said connector comprising a connector plug formed integrally with said resin case and to be mated with another connector, and an electrode provided integrally with said resin case by insert molding.

10. The control unit according to claim 1, wherein said baseboard has an opening being equal to or larger than a mounting area of said metal substrate where said drive circuit is mounted, the mounting area of said metal substrate being exposed on one side of said baseboard opposite to the other side where said metal substrate is attached, an inner surface of said opening and the mounting area of said metal substrate forming a concave portion for filling a molding material.

11. The control unit according to claim 1, wherein a predetermined region of the circuit conductor constituent member of said baseboard and a predetermined circuit conductor of said metal substrate are connected by a wire bonding.

12. The control unit according to claim 1, further comprising:
an insulating cover member covering at least one surface of said baseboard opposite to the other surface where said metal substrate is attached to form an outside wall of said control unit.

13. The control unit according to claim 12, wherein an attaching portion of said cover member is sealed by an adhesive seal.

14. The control unit according to claim 1, wherein the large current circuit component containing at least the power back-up capacitor is mounted on a component portion of said baseboard different from a substrate portion where said insulating substrate and said metal substrate are attached.

15. The control unit according to claim 1, wherein said power back-up capacitor is disposed on one end side portion of said baseboard, and said metal substrate is disposed on the other end side portion of said baseboard.

16. The control unit according to claim 1, further comprising:
a vent portion allowing a ventilation of the air into and out of said control unit; said vent portion including a breather space partitioned from an inside of the control unit; an outside vent hole for communicating said breather space to an outside of the control unit with a smaller cross sectional area than that of said breather space; and an inside vent hole for communicating said breather space into the control unit and fitted with a filter porous to air but impervious to water.

17. A control unit for an electric power steering device having an assist motor linked to a steering system of a vehicle to generate a steering auxiliary torque, said control unit comprising:
a breather space partitioned from an inside of the control unit;
an outside vent hole for communicating said breather space to an outside of the control unit with a smaller cross sectional area than that of said breather space; and
an inside vent hole for communicating said breather space into the control unit and fitted with a filter porous to air but impervious to water.

18. A vehicle comprising a control unit, the control unit comprising:
a breather space partitioned from an inside of the control unit;
an outside vent hole for communicating said breather space to an outside of the control unit with a smaller cross sectional area than that of said breather space; and
an inside vent hole for communicating said breather space into the control unit and fitted with a filter porous to air but impervious to water.

19. A method of manufacturing a control unit for an electric power steering device having an assist motor linked to a steering system of a vehicle to generate a steering auxiliary torque, said control unit having a drive circuit having a switching element for switching a connection of each coil terminal of said assist motor to a high potential power line or a low potential power line, a control circuit for controlling an operation of said switching element of said drive circuit to control an operation of said assist motor, and a large current circuit component containing a power back-up capacitor connected to the high potential power line, said method comprising:
mounting the drive circuit on one surface of a metal substrate;
mounting the control circuit on one surface of an insulating substrate;
forming a baseboard having a metallic circuit conductor constituent member integrated with a resin base substrate by an insert molding;
mounting the large current circuit component on the baseboard;
attaching the metal substrate and the insulating substrate on the baseboard to overlap each other.

* * * * *